(12) United States Patent
Shimizu et al.

(10) Patent No.: US 7,470,886 B2
(45) Date of Patent: Dec. 30, 2008

(54) LIGHT RECEIVING CIRCUIT, SEMICONDUCTOR LASER DEVICE, AND OPTICAL PICKUP DEVICE

(75) Inventors: Yuzo Shimizu, Mishima-gun (JP);
Hisatada Yasukawa, Kyotanabe (JP);
Shinichi Hamaguchi, Amagasaki (JP);
Kenji Imaizumi, Takatsuki (JP);
Shinichi Miyamoto, Takatsuki (JP);
Yosuke Kuroiwa, Takatsuki (JP)

(73) Assignee: Panasonic Corporation, Osaka (JP)

( * ) Notice: Subject to any disclaimer, the term of this patent is extended or adjusted under 35 U.S.C. 154(b) by 380 days.

(21) Appl. No.: 11/328,139

(22) Filed: Jan. 10, 2006

(65) Prior Publication Data
US 2006/0233207 A1    Oct. 19, 2006

(30) Foreign Application Priority Data
Apr. 13, 2005    (JP)    ............................... 2005-115754

(51) Int. Cl.
*H03F 3/08*    (2006.01)
(52) U.S. Cl. .......................... 250/214 A; 250/214 AG; 250/214 C; 250/226; 369/112.22; 369/134; 372/29.021; 372/33
(58) Field of Classification Search ............. 250/214 A, 250/214 AG, 214 C, 214.1, 216, 226, 205; 330/308; 369/112.01, 112.22, 134, 53.31; 372/29.02, 29.021, 31, 33
See application file for complete search history.

(56) References Cited

U.S. PATENT DOCUMENTS

| 4,013,845 | A | * | 3/1977 | Sugimoto et al. | ............ 369/134 |
| 6,479,810 | B1 | * | 11/2002 | Weindorf | ............... 250/214 AL |
| 6,603,110 | B2 | * | 8/2003 | Hayami et al. | ........... 250/214 R |
| 6,674,709 | B1 | * | 1/2004 | Asada et al. | ............ 369/112.01 |
| 6,720,826 | B2 | * | 4/2004 | Yoon | ............................ 330/69 |
| 6,768,096 | B2 | * | 7/2004 | Hammond et al. | ........... 250/226 |
| 6,933,485 | B2 | * | 8/2005 | Livermore et al. | ........... 250/205 |

FOREIGN PATENT DOCUMENTS

JP    11041036    2/1999

* cited by examiner

*Primary Examiner*—Stephen Yam
(74) *Attorney, Agent, or Firm*—Dickinson Wright, PLLC

(57) ABSTRACT

There is provided a light receiving circuit capable of preventing an output variation of the light receiving circuit due to a change in ambient temperature with a simple configuration.

The light receiving circuit is provided with a photodiode 4 for LD power monitoring and an I-V amplifier 5 connected with a feedback resistor 13, wherein a light receiving section 16 of the photodiode 4 is covered with a protective film 19. Temperature dependences between a light transmittance of the protective film 19 in accordance with a shift of a wavelength of a laser beam due to a change in ambient temperature, and a resistance value of the feedback resistor 13 are set in such a way that they may be mutually compensated and an output voltage from the light receiving circuit may be constant for a temperature change.

39 Claims, 8 Drawing Sheets

Fig. 7A RELATED ART
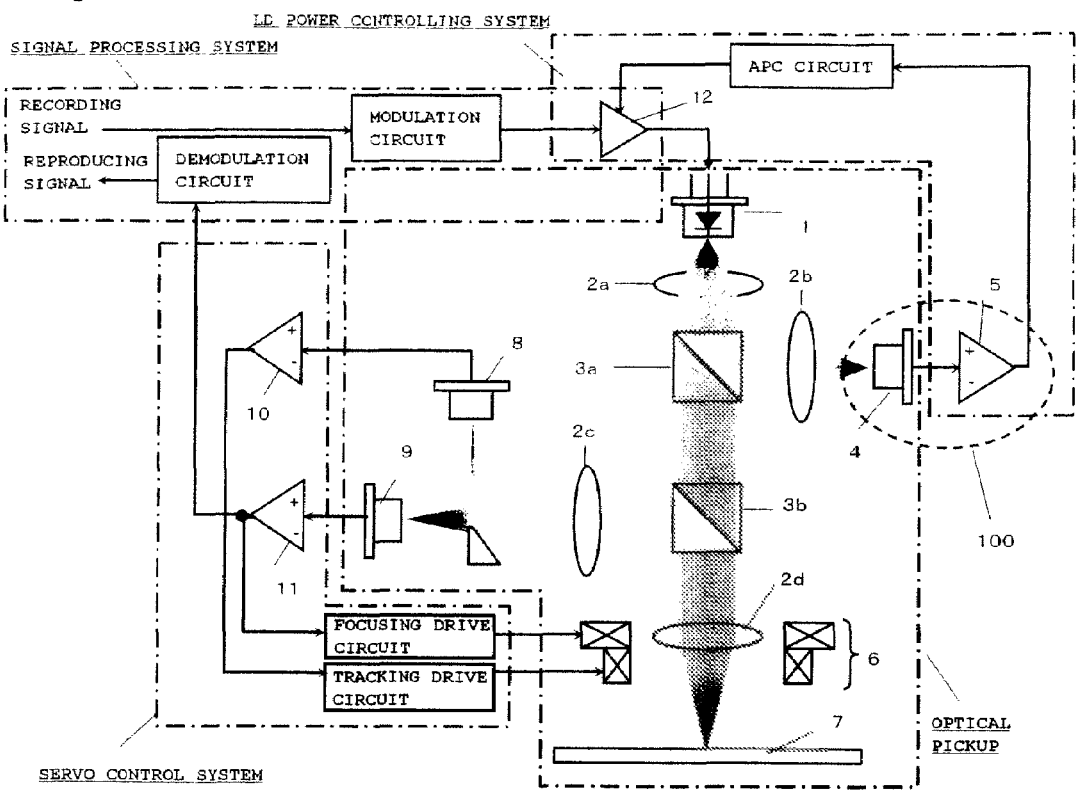
Fig. 7B
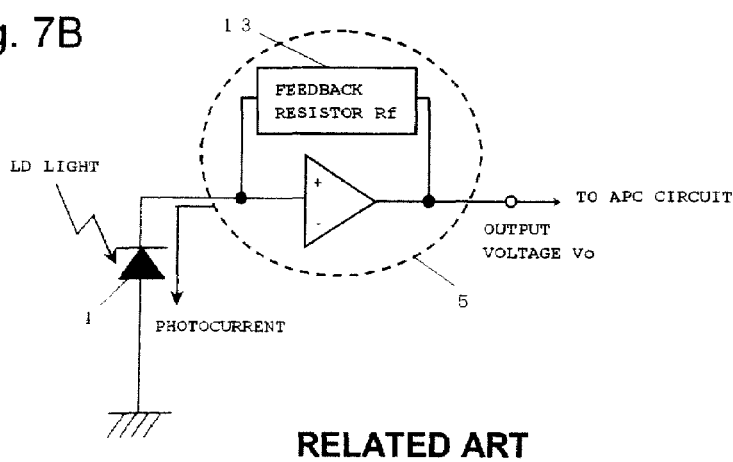
RELATED ART

LIGHT RECEIVING CIRCUIT, SEMICONDUCTOR LASER DEVICE, AND OPTICAL PICKUP DEVICE

BACKGROUND OF THE INVENTION

1. Field of the Invention

The present invention relates to a light receiving circuit, a semiconductor laser device, and an optical pickup device used for an optical information processing, an optical measurement, an optical communication, or an optical recording disk or the like.

2. Background Art

In recent years, as a high-capacity information storage medium used for personal computers or recording a TV broadcast, an optical disk medium to which information can directly written, a so-called recording type optical disk medium has been popularized. The exemplary recording type optical disks include a CD-R and a DVD-R as write-once medium, and a CD-RW, a DVD-RW, and a DVD-RAM as repeatedly erasable/recordable medium.

FIG. 7 is a schematic diagram of an optical pickup device according to the conventional art, wherein FIG. 7A shows an overall configuration and FIG. 7B shows a configuration of a light receiving circuit 100 for LD power monitoring including a photodiode 4 for LD power monitoring and a photocurrent/voltage conversion amplifier 5 for LD power monitoring (for example, refer to Japanese Unexamined Patent Publication (Kokai) 11-41036).

In FIG. 7, reference numeral 1 represents a semiconductor laser diode (hereinafter, referred to as LD); reference numerals 2a, 2b, 2c, and 2d, lenses; reference numerals 3a and 3b, beam splitters; reference numeral 4, the photodiode for LD power monitoring; reference numeral 5, the photocurrent/voltage conversion amplifier for LD power monitoring; reference numeral 6, an actuator; reference numeral 7, an optical disk; reference numeral 8, a photodiode (PD) for tracking servo control; reference numeral 9, a photodiode (PD) for focusing servo control; reference numeral 10, a photocurrent/voltage conversion amplifier for tracking servo control; reference numeral 11, a photocurrent/voltage conversion amplifier for focusing servo control; reference numeral 12, a laser driving circuit; and reference numeral 13, a feedback resistor.

As can be seen from FIG. 7, the I-V amplifiers 5, 10, and 11 are configured as single-stage amplifiers, respectively, but a plurality of amplifiers may be optionally added after these I-V amplifiers.

In the optical pickup device as shown in FIG. 7, light emitting power of the semiconductor laser diode 1, used for reproduction, recording, or erasing of the optical disk 7, needs to be precisely controlled so as to stably emit a light at predetermined light emitting power corresponding to respective modes of reproduction, recording, and erasing.

In the optical pickup device shown in FIG. 7, the beam splitter 3a splits the light emitted from the LD 1, and the photodiode 4 for LD power monitoring receives the split light. A photocurrent as an output from the photodiode 4 for LD power monitoring is then converted into a voltage output by the photocurrent/voltage conversion amplifier 5 for LD power monitoring, and the feedback control to the laser driving circuit 12 is performed through an automatic power control (APC) circuit so that the voltage output may become constant. As a result of this, the light emitting power of the LD 1 is controlled to be constant.

In addition, according to this configuration, while there is provided with the photodiode 4 for LD power monitoring (hereinafter, photodiode is abbreviated to PD) dedicated to detecting the LD power, some optical pickup devices may combine both of a role for monitoring the LD power, and a role of a PD 9 for focusing servo control or the PD 8 for tracking servo control.

SUMMARY OF THE INVENTION

The aforementioned conventional configuration, however, has following problems.

That is, even when the LD 1 actually outputs the light at desired constant power, if the light receiving circuit 100 has a temperature coefficient, the output voltage from the amplifier 5 may vary in accordance with a change in outside temperature or the like. The feedback control to the LD driving circuit 12 is performed by the APC circuit corresponding to the variation, so that the light emitting power from the LD 1 will be substantially changed.

As described above, actually, although the LD 1 properly emits the light at the desired constant power, output characteristics of the light receiving circuit 100 have temperature dependence, so that the feedback may be performed so as to emit the light at power different from the desired power.

If the feedback is performed so as to emit the light at the power different from the desired power, supposing that the output from the light receiving circuit 100 has a negative temperature coefficient for example, when the temperature increases, the feedback is performed by the APC circuit so as to increase the light emitting power of the LD 1 in spite of even reproducing the disk, so that the light emitting power of the LD 1 substantially increases, thus causing the problem that the information is accidentally recorded on the optical disk or the information is accidentally erased from an rewritable disk or the like.

As an opposite example, supposing that the output from the light receiving circuit 100 has a positive temperature coefficient, when the temperature increases, the feedback is performed by the APC circuit so as to decrease the light emitting power of the LD 1 in spite of recoding the disk, so that the light emitting power of the LD 1 substantially decreases, thus causing the problem that the information cannot be recorded on the optical disk because the light emitting power required inherently for recording the information can not be obtained.

In order to avoid such problems, it is desired that the output voltage from the light receiving circuit 100 has characteristics not to vary against the change in temperature, namely a characteristic to be flat to the temperature.

As described above, along with the popularization of the recording type optical disk medium in recent years, how to eliminate the temperature dependence of the output voltage from the light receiving circuit 100 has been required as an essential technique in the optical pickup device.

For that reason, the problems of the conventional art will be described in more detail.

In the conventional art, the temperature coefficient of the output voltage of the I-V amplifier 5 is adjusted so as to flatten the temperature coefficient of the light receiving circuit 100.

Here, since the temperature coefficient of the output voltage of the I-V amplifier 5 is determined substantially based on the temperature coefficient of the feedback resistor 13 for determining a gain of the I-V amplifier 5, in order to adjust the temperature coefficient of the output voltage of the I-V amplifier 5, the temperature coefficient of the feedback resistor 13 needs to be changed, for example.

In order to adjust the temperature coefficient of the feedback resistor 13 of the I-V amplifier 5, it is usually required to change a material for forming the feedback resistor 13. Types of the feedback resistor 13, for example in forming the resistor in a semiconductor chip, may include a diffused resistor formed by diffusing an impurity into a semiconductor substrate, and a polysilicon resistor formed by depositing a polysilicon layer on the semiconductor substrate.

In order to adjust the temperature coefficients of such feedback resistors, it is required to change the types of impurity materials to be diffused, or a material of the polysilicon or the like. The temperature coefficient may also be adjusted by combining two or more resistors formed of different materials having different temperature coefficients.

Referring to FIG. 8, there will be schematically described an aspect for adjusting the temperature coefficient of the output voltage Vo of the light receiving circuit 100 by adjusting the temperature coefficient of the feedback resistor 13.

FIG. 8A shows a temperature coefficient of the output voltage Vo of the light receiving circuit 100 before adjustment, where the temperature coefficient shown therein is cited by way of example.

In addition, in FIG. 8A, an ordinate denotes a variation rate of the output voltage Vo at respective temperatures normalized by the output voltage at a temperature of −10° C.

In the example shown in FIG. 8A, the output voltage Vo has a negative temperature coefficient, namely the output voltage decreases as the temperature increases, where the output voltage Vo varies by approximately −3% in the range of temperature from −10° C. to 70° C.

It is assumed that the output voltage Vo has the temperature coefficient as shown in FIG. 8A, and the temperature coefficient of a resistance value of the feedback resistor 13 has characteristics shown in, for example FIG. 8B.

In FIG. 8B, an ordinate denotes a variation rate of the resistance value at the respective temperatures normalized by the resistance value at the temperature of −10° C.

As shown in FIG. 8B, the temperature coefficient of the feedback resistor 13 generally varies linearly with respect to the temperature change, and the inclination with respect to the temperature change is usually determined by the material forming the resistor. In this example, the feedback resistor 13 has the resistance value as the temperature coefficient which varies by approximately −2% in the range of temperature from −10° C. to 70° C.

When a system for monitoring the output of the LD and determining a monitored output has an aforementioned configuration, it is assumed that the temperature coefficient of the output voltage Vo from the light receiving circuit 100 is adjusted to be flat against the temperature change.

FIG. 8C shows the temperature dependence of the output voltage Vo after adjustment of the temperature coefficient. In FIG. 8C, it is shown that the temperature coefficient of the output voltage Vo from the light receiving circuit 100 is adjusted by apparently rotating the inclination of the temperature coefficient in a counterclockwise direction by a degree of θ° with the output at −10° C. as an origin (bold line) with respect to the temperature coefficient thereof before adjustment (dashed line).

In this case, the variation in output voltage Vo after adjustment is controlled within approximately 1% in the range of temperature from −10° C. to 70° C. Usually, as shown in FIG. 8C, when the temperature coefficient of the output voltage Vo is desired to be apparently rotated by the degree of θ°, it can be achieved by apparently rotating the temperature coefficient of the feedback resistor 13 by the degree of θ° with respect to that before adjustment (dashed line) as shown in FIG. 8D.

In order to suppress the variation in temperature coefficient of the output voltage within 1%, as shown in FIG. 8D, as the inclination of the temperature coefficient of the feedback resistor 13, it is required to make the resistance value vary by approximately +1% in the range of temperature from −10° C. to 70° C.

As described above, in order to change the inclination of the temperature coefficient of the feedback resistor 13, however, the material itself to form the feedback resistor 13 needs to be reconsidered, so that unless the material to form the resistor is changed before and after adjustment, it cannot not be achieved, thereby the temperature coefficient of the feedback resistor has not been able to be readily changed.

As will be understood, in order to change the temperature coefficient of the feedback resistor 13, since there has been required to select and reconsider the material itself of the feedback resistor 13 as needed, it has not been easy but difficult to adjust and control the temperature coefficient of the I-V amplifier 5.

Moreover, in the case of forming the feedback resistor 13 in the semiconductor chip, the process conditions for fabricating the semiconductor have also been required to be reconsidered along with the material change, so that the feedback resistor 13 could not be readily changed, thus leading to difficulty in adjusting the temperature coefficient of the I-V amplifier.

The present invention aims at solving the aforementioned conventional problems and providing a light receiving circuit, a semiconductor laser device, and an optical pickup device, capable of preventing an output variation of the light receiving circuit caused by a change in ambient temperature, with a simple configuration.

The present invention is summarized in that a temperature coefficient of the light receiving circuit may be flattened by controlling a thickness of a protective film formed on a PD without changing a material of a feedback resistor from conventional materials, the temperature coefficient can be improved more readily than improving the temperature coefficient by reconsidering the material for forming the feedback resistor as is conventionally achieved, and in addition to that, the temperature coefficient as a system can be controlled optionally only by designing the thickness of the protective film.

In order to solve the aforementioned problems, a light receiving circuit according to the present invention is provided with a light receiving section, and a photocurrent/voltage conversion amplifier for amplifying a photocurrent photoelectrically converted in the light receiving section, wherein a protective film is formed on the light receiving section, the protective film having a temperature coefficient of a transmittance of the protective film in accordance with a change in wavelength of a light transmitting therethrough, a feedback resistor related to a gain is connected to the photocurrent/voltage conversion amplifier, the feedback resistor having a temperature coefficient of a resistance in accordance with a temperature change, and the temperature coefficient of the transmittance and the temperature coefficient of the resistance are set so that the output voltage from the photocurrent/voltage conversion amplifier may be substantially constant to the temperature change.

According to the light receiving circuit of the present invention, the temperature coefficient of the output voltage can be readily adjusted or changed only by changing the thickness of the protective film on a light receiving element or the like, so that by compensating for a temperature dependence of a resistance value with the temperature dependence of a light transmittance of the protective film or the like accompanied by the light wavelength which will be shifted by the change in ambient temperature, a high-performance light receiving amplifier circuit capable of preventing the output variation due to the temperature change can be readily achieved.

Another light receiving circuit according to the present invention is provided with a light receiving section, and a photocurrent/voltage conversion amplifier for amplifying a photocurrent photoelectrically converted in the light receiving section, wherein the light transmitting member is formed on the light receiving section, the light transmitting member having a temperature coefficient of a transmittance of the light transmitting member in accordance with a change in wavelength of a light transmitting therethrough, a feedback resistor related to a gain is connected to the photocurrent/voltage conversion amplifier, the feedback resistor having a temperature coefficient of a resistance in accordance with a temperature change, and the temperature coefficient of the transmittance and the temperature coefficient of the resistance are set so that the output voltage from the photocurrent/voltage conversion amplifier may be substantially constant to the temperature change.

Preferably, the light receiving section and the photocurrent/voltage conversion amplifier are formed on the same semiconductor substrate.

Preferably, the light receiving section and the photocurrent/voltage conversion amplifier are housed in the same package.

Preferably, in the package, a light transmitting member is disposed on at least a portion where the light enters thereinto.

Another light receiving circuit according to the present invention is provided with a light receiving section, and a photocurrent/voltage conversion amplifier for amplifying a photocurrent photoelectrically converted in the light receiving section, wherein a protective film is formed on the light receiving section while a light transmitting member is disposed thereon, the protective film and the light transmitting member respectively having temperature coefficients of transmittances in accordance with a change in wavelength of a light transmitting therethrough, a feedback resistor related to a gain is connected to the photocurrent/voltage conversion amplifier, the feedback resistor having a temperature coefficient of a resistance in accordance with a temperature change, and the temperature coefficients of the transmittance of the protective film and the light transmitting member, and the temperature coefficient of the resistance are set so that an output voltage from the photocurrent/voltage conversion amplifier may be substantially constant to the temperature change.

A semiconductor laser device according to the present invention is provided with a semiconductor laser diode, and the aforementioned light receiving circuit, wherein the light receiving circuit monitors the output from the semiconductor laser diode.

An optical pickup device according to the present invention is provided with the semiconductor laser device of the present invention, and a light receiving section for receiving the reflected light that is emitted from the semiconductor laser device and reflected from a recording medium.

BRIEF DESCRIPTION OF THE DRAWINGS

FIG. 7A is a schematic diagram illustrating an overall configuration of an optical pickup device according to the conventional art;

FIG. 7B is a schematic diagram of a light receiving circuit for LD power monitoring;

PREFERRED EMBODIMENT OF THE INVENTION

Hereinafter, embodiments of the present invention will be described with reference to drawings.

FIRST EMBODIMENT

Figure 1:
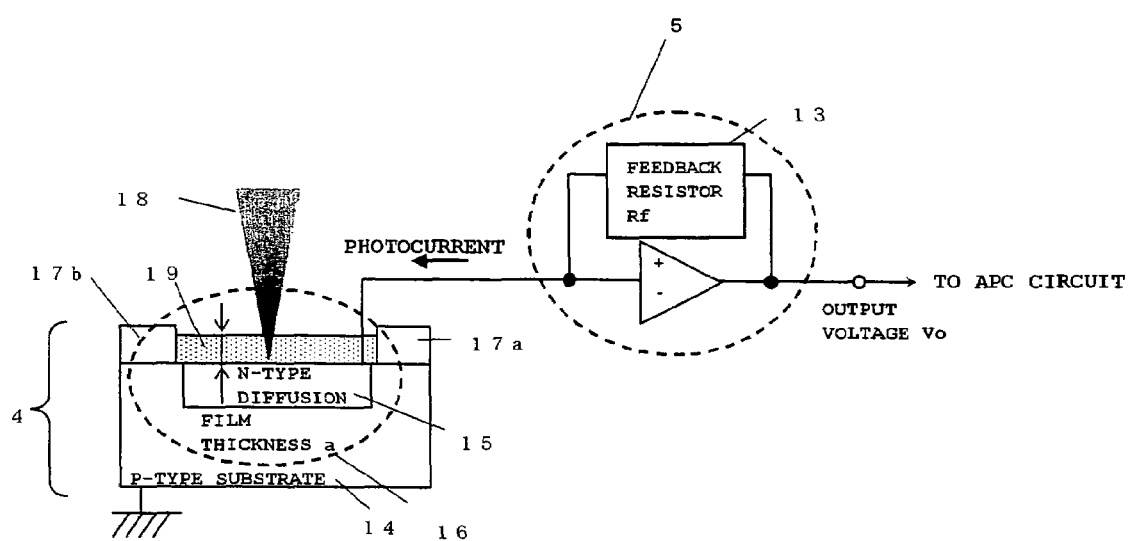
FIG. 1 is a diagram illustrating a configuration of a light receiving circuit according to a first embodiment of the present invention.

FIG. 1 is a diagram illustrating a configuration of a light receiving circuit according to a first embodiment of the present invention.

In FIG. 1, reference numeral 4 represents a photodiode for LD power monitoring; reference numeral 5, a photocurrent/voltage conversion amplifier (I-V amplifier) for LD power monitoring; reference numeral 13, a feedback resistor; reference numeral 14, an p-type semiconductor substrate; reference numeral 15, a n-type diffused region; reference numeral 16, a light receiving section; reference numerals 17a and 17b, substrate protective films; reference numeral 18, an incident light to the photodiode 4 for LD power monitoring; and reference numeral 19, a light receiving section protective film.

It should be noted that the p-type semiconductor substrate 14 and the n-type diffused region 15 may be a combination of a n-type substrate and an p-type diffused region, while a structure of the light receiving section 16 is not limited to that of the present embodiment.

The incident light 18 to the photodiode 4 for LD power monitoring is emitted from a semiconductor laser diode LD (not shown). The LD is normally housed in the same housing with the photodiode 4 for LD power monitoring or the like, and similarly affected by the change in ambient temperature.

As the ambient temperature changes, the light emitted from the LD is normally varied in wavelength.

As an example, in the case of an LD for emitting a blue-violet light, the wavelength may vary from 400 nm to 415 nm as the ambient temperature varies from −10° C. to 75° C.

At this time, when the protective film 19 is formed on the light receiving section 16 as shown in FIG. 1, an apparent light transmittance varies in accordance with the change in wavelength due to the temperature change.

The present invention is intended to flatten a temperature dependence of the output from the light receiving circuit utilizing this phenomenon. Hereinafter, a basic principle of the present invention will be described with reference to FIGS. 2A through 2E.

Figure 2A:
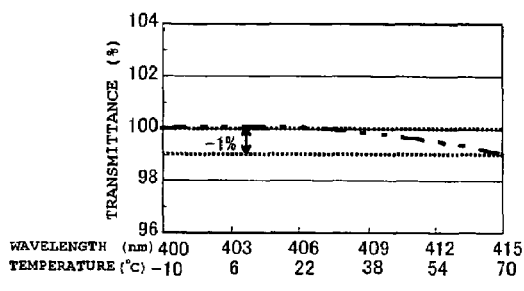
FIG. 2A is a graph showing a temperature dependence of a transmittance of a protective film on a light receiving section as a trend of the temperature dependence of each of parameters according to the first embodiment of the present invention.
Figure 2B:
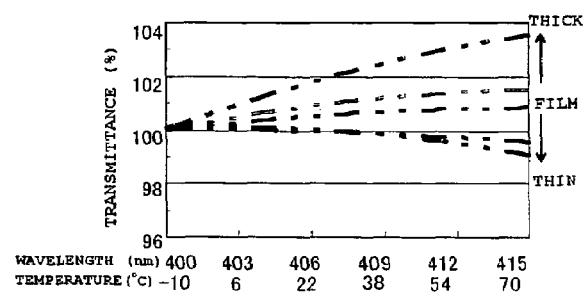
FIG. 2B is a graph showing a change in transmittance in accordance with a thickness of the protective film as the trend of the temperature dependence of each of parameters according to the first embodiment of the present invention.

FIG. 2A is a graph showing a temperature dependence of a transmittance of the protective film 19 and illustrates an example using a blue-violet LD. Incidentally, in FIG. 2A, an abscissa denotes the temperature as well as the wavelength of the LD at a corresponding temperature. The light transmittance is normalized by the transmittance at the temperature of −10° C. Accordingly, transmittances in FIGS. 2A, 2B, and 2D are normalized by each of the aforementioned conditions, respectively. Transmittances in FIGS. 3B, 3D, 5A, 5B, and 5D, which will be hereinbelow described, are also normalized in a similar manner to that in FIGS. 2A, 2B, and 2D.

As can be seen from the graphs, in an optical pickup system, the wavelength varies in accordance with the temperature change, thus causing the phenomenon that the transmittance of the light passing through the protective film 19 varies with the temperature change.

It is known that the light transmittance varies by increasing or decreasing the thickness of the protective film 19. FIG. 2B shows an aspect of the light transmittance as an example varying in accordance with the change in wavelength for different film thicknesses. Generally, as shown in the figure, the transmittance of the protective film 19 having the greater thickness varies more sensitively to the change in wavelength.

According to the present invention, the temperature dependence on a response of the light receiving circuit is flattened utilizing the foregoing phenomenon.

In other words, as described above, since the apparent transmittance of the protective film 19 varies in accordance with the change in ambient temperature, an amount of the incident light 18 entering into the light receiving section 16 varies as well, so that a photocurrent input to the I-V amplifier 5 varies, resulting in apparent change in the output voltage Vo from the I-V amplifier 5 with the change in temperature.

As a result, in order to vary the temperature coefficient of the output voltage Vo from the I-V amplifier 5, since the temperature change of the transmittance varies in accordance with the thickness due to adjustment of the thickness of the protective film 19, so that it is possible to optionally adjust the apparent output voltage temperature coefficient as the I-V amplifier 5.

Figure 2C:
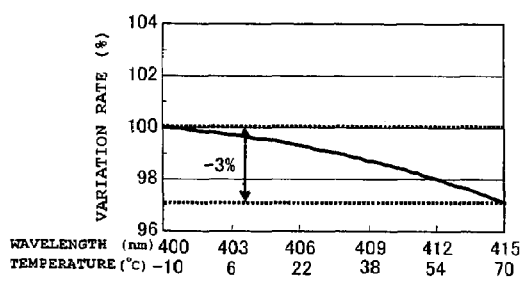
FIG. 2C is a graph showing a temperature dependence of an output voltage from the light receiving circuit as the trend of the temperature dependence of each of parameters according to the first embodiment of the present invention.
Figure 2D:
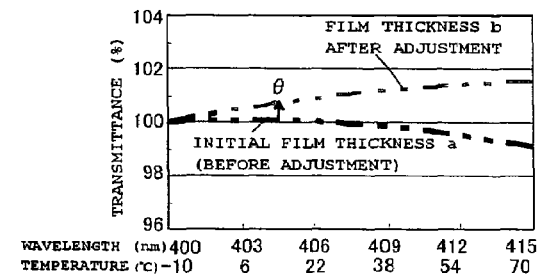
FIG. 2D is a graph showing a temperature dependence of a transmittance of the protective film after adjustment in thickness as the trend of the temperature dependence of each of parameters according to the first embodiment of the present invention.

FIG. 2C shows the temperature dependence of the output voltage Vo from the light receiving circuit shown in FIG. 1 before adjustment. Here, the output voltage is normalized by an output voltage at a temperature of −10° C.

Figure 2E:
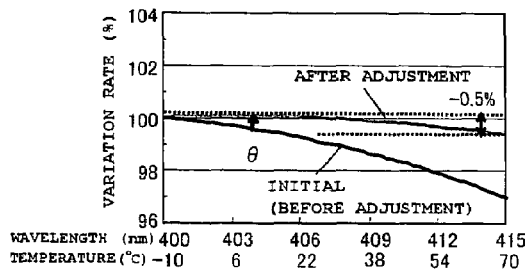
FIG. 2E is a graph showing a temperature dependence of the output voltage after adjustment in thickness of the protective film as the trend of the temperature dependence of each of parameters according to the first embodiment of the present invention.

As shown in FIG. 2C, the output voltage varies by approximately −3% in the range of temperature from −10° C. to 70° C. As a result, as shown in FIG. 2D, the thickness of the protective film is set to be greater than that before adjustment so that the temperature change of the transmittance may apparently rotate by a degree of θ°. FIG. 2E shows the temperature coefficient of the I-V amplifier 5 at this time.

According to the present embodiment, by utilizing the phenomenon that the inclination of the temperature change of the transmittance varies in accordance with the film thickness as shown in FIG. 2B, to apparently rotate the temperature change of the transmittance by the degree of θ° by changing the thickness of the protective film as shown in FIG. 2D will lead the temperature coefficient of the I-V amplifier 5 to be also varied by the degree of θ°, thereby making it possible to flatten the temperature coefficient of the I-V amplifier 5.

FIG. 2E shows an example where the temperature change of the output voltage Vo before adjustment has been approximately −3%, which is improved to be approximately −0.5% after adjustment.

As will be understood, grasping the temperature dependence of the light transmittance of the protective film 19 on the light receiving section 16 in advance to thereby set the thickness of the protective film 19 so that the temperature dependence thereof and the temperature dependence of the output from the I-V amplifier 5 may be mutually canceled will make it possible to eliminate the effect of the ambient temperature against the output from the light receiving circuit, thus allowing the output from the semiconductor laser diode LD to be stabilized. As a result of this, the high reliability can be provided without causing the malfunction in recording or reproduction of the optical pickup device using these devices.

In addition, a configuration of the light receiving section protective film 19 is not described in detail, but it may be either a single layer or a laminated structure with a plurality of layers. In the case of the laminated structure, by properly combining the layers having different thicknesses, the temperature coefficient of the I-V amplifier 5 can be optionally controlled.

FIG. 3 shows a specific example according to the present embodiment.

In the specific example, the range of the temperature is from −10° C. to 70° C., the blue-violet laser is used as the incident light where the laser wavelength varies in the range from 400 nm to 415 nm as the temperature varies in the foregoing range.

Figure 3A:
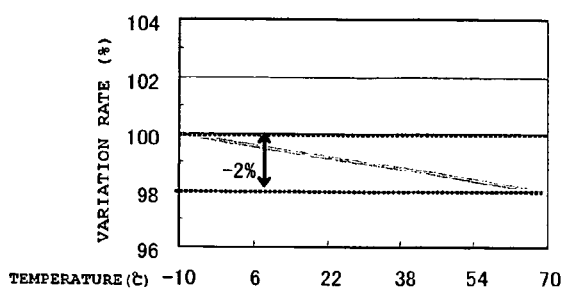
FIG. 3A is a graph showing a temperature dependence of a feedback resistor as the temperature dependence of each of parameters according to the first embodiment of the present invention.

FIG. 3A is a graph showing the temperature dependence of the resistance value when a polysilicon resistor having the temperature coefficient of approximately −250 ppm/° C. is used as the feedback resistor 13 shown in FIG. 1. Incidentally, the resistance value is normalized by a resistance value at the temperature of −10° C.

In the case shown in FIG. 3A, the resistance value of the feedback resistor 13 varies by approximately −2% in the range of ambient temperature from −10° C. to 70° C.

Figure 3B:
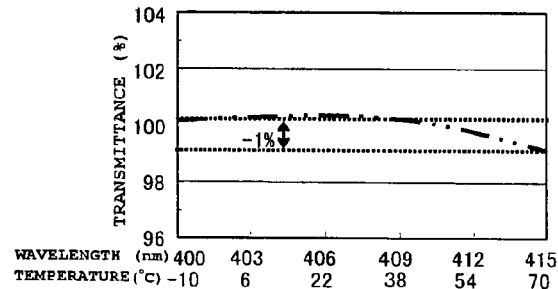
FIG. 3B is a graph showing a temperature dependence of the transmittance of the protective film as the temperature dependence of each of parameters according to the first embodiment of the present invention.

FIG. 3B shows the temperature dependence of the transmittance of the protective film 19 on the light receiving section 16. It should be noted that the protective film 19 has a two-layer structure where a silicon dioxide ($SiO_2$) film with a thickness of approximately 6 nm is formed on the p-type semiconductor substrate 14, for example an p-type silicon substrate, and a silicon nitride (SiN) film with a thickness of approximately 36 nm is formed thereon. Incidentally, the transmittance is normalized by a transmittance at the temperature of −10° C.

In the case shown in FIG. 3B, the transmittance of the protective film 19 varies by approximately −1% in the range of ambient temperature from −10° C. to 70° C.

Figure 3C:
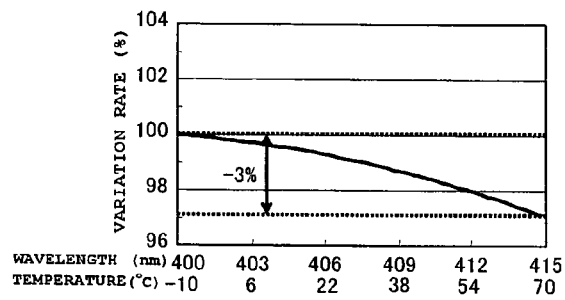
FIG. 3C is a graph showing a temperature dependence of the output voltage from the light receiving circuit as the temperature dependence of each of parameters according to the first embodiment of the present invention.

FIG. 3C shows the temperature dependence of the output voltage Vo from the light receiving circuit provided with the feedback resistor 13 and the protective film 19 having the characteristics shown in FIGS. 3A and 3B, respectively. Incidentally, the output voltage is normalized by the output at the temperature of −10° C.

As shown in FIG. 3C, the output voltage Vo varies by approximately −3% in the range of ambient temperature from −10° C. to 70° C., which results in a sum of the changes in resistance value and transmittance with the temperature change shown in FIGS. 3A and 3B, respectively.

Figure 3D:
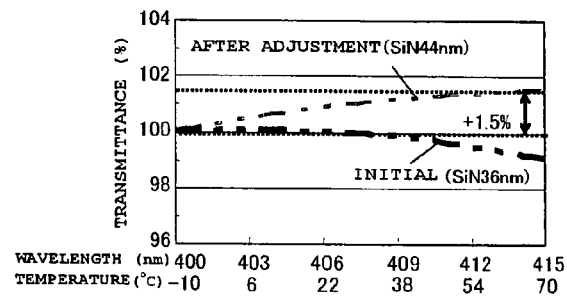
FIG. 3D is a graph showing a temperature dependence of a transmittance of the protective film after adjustment in thickness as the temperature dependence of each of parameters according to the first embodiment of the present invention.

Herein, the transmittance of the light receiving section protective film 19 is adjusted by changing the thickness of the SiN film to approximately 44 nm while holding the thickness of the $SiO_2$ film unchanged. FIG. 3D shows the temperature dependence of the transmittance of the protective film 19 with this configuration. As can be understood from the figure, while the variation in transmittance of the protective film before adjustment has been approximately −1% in the range of temperature from −10° C. to 70° C., the change can be improved to be approximately +1.5% after adjustment.

Figure 3E:
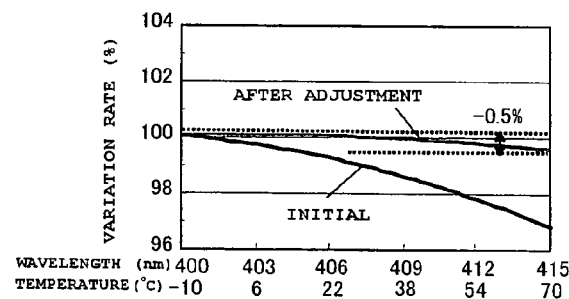
FIG. 3E is a graph showing a temperature dependence of the output voltage after adjustment in thickness of the protective film as the temperature dependence of each of parameters according to the first embodiment of the present invention.

FIG. 3E shows the temperature dependence of the output voltage Vo after adjusting the thickness of the protective film 19 as described above. As can be understood from the figure, while the variation in the output voltage before adjustment has been approximately −3% in the range of temperature from −10° C. to 70° C., the change can be improved to be approximately −0.5% after adjustment.

As described above, according to the present embodiment, that makes it possible to prevent the variation of the output of the light receiving circuit for LD power monitoring due to the change in ambient temperature with a simple configuration, thereby making it possible to stabilize the output from the LD.

Moreover, utilizing the light receiving circuit of the present embodiment with the LD will allow the high-performance semiconductor laser device to be achieved, while suppressing the output variation due to the change in ambient temperature. Furthermore, applying the light receiving circuit of the present embodiment to the optical pickup device as shown in FIG. 7 will allow the malfunction due to the change in ambient temperature to be prevented, thereby making it possible to significantly increase the reliability. It should be noted that the respective photocurrent/voltage conversion amplifiers 5, 10, and 11 in FIG. 7 are configured as a single-stage amplifier formed by the I-V amplifier, but the present invention is not limited to such a configuration, so that the effect of the present invention can be similarly achieved utilizing the plurality of amplifiers optionally added after the I-V amplifier.

SECOND EMBODIMENT

Figure 4A:
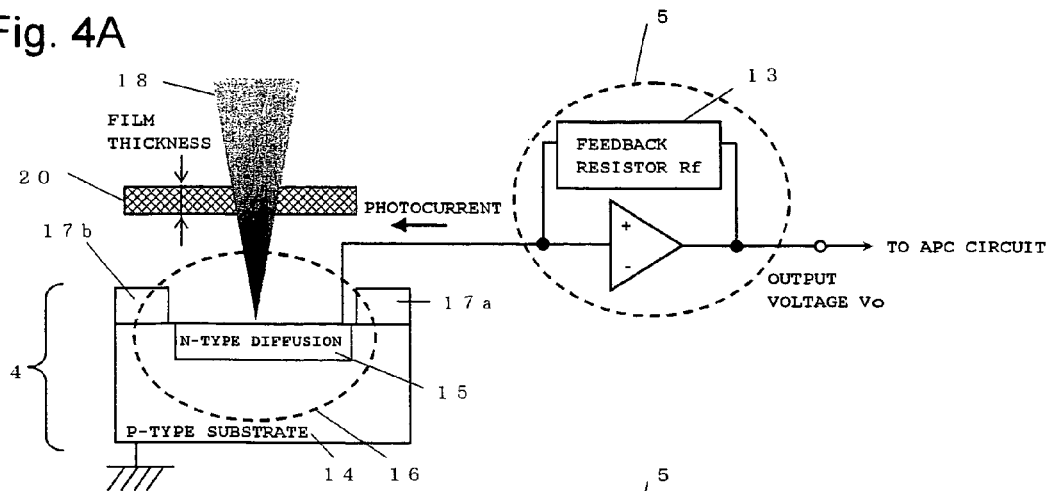
FIG. 4A is a schematic diagram illustrating a configuration of a light receiving circuit without a protective film on a light receiving section according to a second embodiment of the present invention.
Figure 4B:
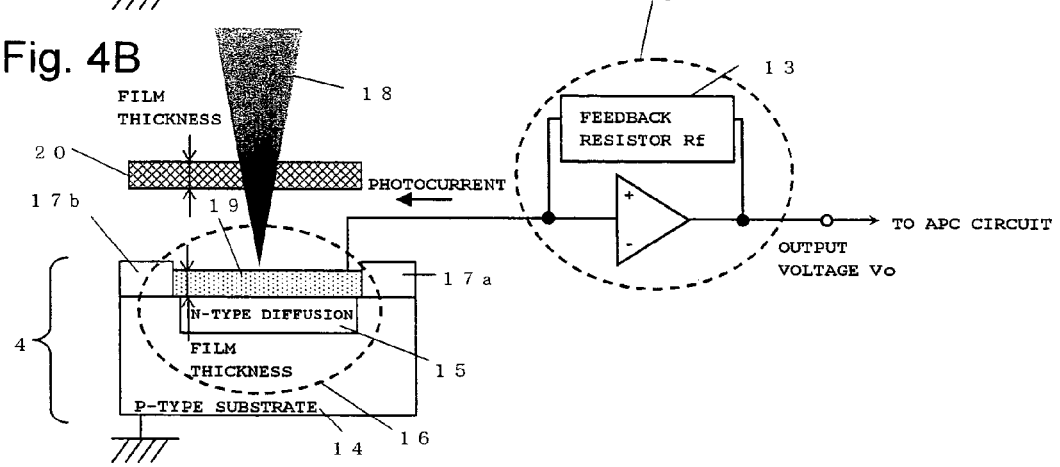
FIG. 4B is a schematic diagram illustrating a configuration of the light receiving circuit with the protective film on the light receiving section according to the second embodiment of the present invention.
Figure 4C:
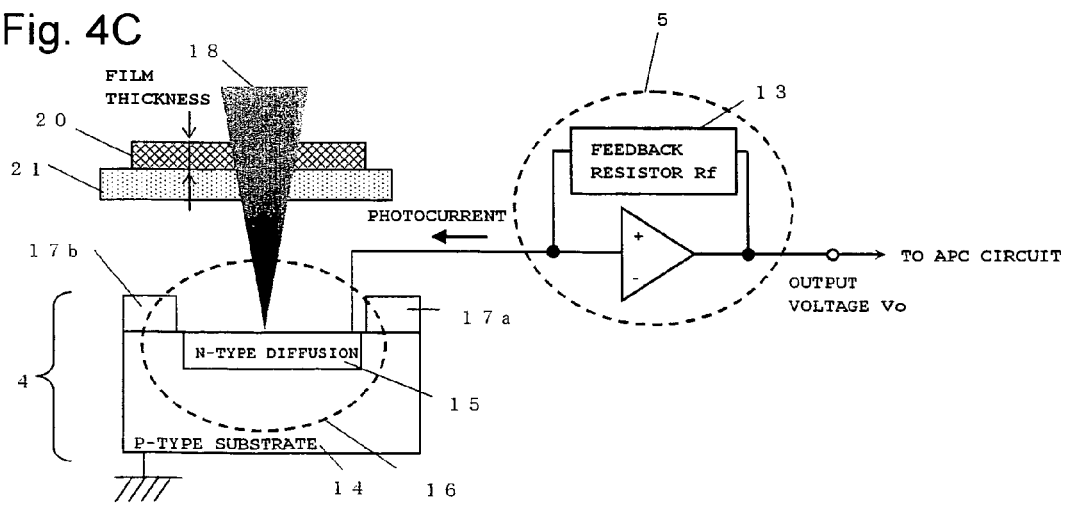
FIG. 4C is a schematic diagram illustrating a configuration of the light receiving circuit with a light transmitting member coated on a glass plate according to the second embodiment of the present invention.

FIGS. 4A through 4C are diagrams illustrating configurations of the light receiving circuit according to a second embodiment of the present invention, wherein FIG. 4A shows the circuit without the protective film on the light receiving section; FIG. 4B, the circuit with the protective film on the light receiving circuit; and FIG. 4C, the circuit having the configuration of FIG. 4A with a light transmitting member coated on a glass plate.

In FIGS. 4A through 4C, reference numeral 20 represents the light transmitting member formed by a light transmitting material, and reference numeral 21 represents a glass substrate. For the other elements common with those in FIG. 1, the same reference numerals with FIG. 1 are provided and the description thereof will be omitted.

According to the present embodiment, it is characterized in that the light transmitting member 20 is disposed above the light receiving section 16. The incident light 18 enters into the light receiving section 16 through the light transmitting member 20. The light transmitting member 20 includes, for example, a light transmitting filter or a coating film for an antireflection coating such as that deposited on a surface of a lens positioned on an optical axis of the incident light 18 passing therethrough to the light receiving section 16.

The light transmitting member 20 serves in a manner similar to that of the protective film 19 described in the first embodiment. In other words, the wavelength of the incident light 18 passing through the light transmitting member 20 varies with the temperature change, and in addition to that, the transmittance of the light transmitting member 20 varies as shown in FIG. 2A in accordance with the changes in film thickness of the light transmitting member 20 and in wavelength, so the amount of the incident light 18 entering into the light receiving section 16 varies, thereby the input to the I-V amplifier 5 is apparently changed, resulting in the change in the output voltage Vo with the temperature change.

In a manner similar to that of the first embodiment, properly designing the film thickness of the light transmitting member 20 will allow the output voltage Vo to be changed with a desired temperature change. The principle for optionally adjusting the change in the output voltage Vo with the temperature change is completely similar to that of the first embodiment, and the description thereof will be omitted.

Similarly, as shown in FIG. 4B, even when both the protective film 19 and the light transmitting member 20 which transmits the light are provided, properly designing the combination of the respective thicknesses of the protective film 19 and the light transmitting member 20 will allow the temperature coefficient of the output voltage Vo to be adjusted. It should be noted that the materials of the protective film 19 and the light transmitting member 20 are not necessarily the same, and the present invention is not limited by the materials thereof.

As described above, according to the present embodiment, as long as at least one light transmitting member 20 formed of a material whose transmittance to a substance varies in accordance with the change in wavelength of the incident light 18 with the temperature change is positioned on the optical axis of the incident light 18 passing therethrough, the effect of adjusting the temperature coefficient of the output voltage described above can be achieved.

Here, a specific example of adjusting the temperature dependence of the output voltage Vo or the like will be described with reference to FIGS. 4C, and 5A through 5E. It should be noted that according to the example, the range of temperature variation, the LD to be used, and the variation amount of the wavelength are the same as those in the example of the first embodiment.

In FIG. 4C, magnesium fluoride is used for the light transmitting member 20, which is coated on the surface (plane of light incidence) of the glass plate 21 made of borosilicate glass. In this embodiment, the thickness of magnesium fluoride is approximately 190 nm.

The material and the temperature dependence of the resistance change of the feedback resistor 13 are similar to those of the first embodiment.

Figure 5A:
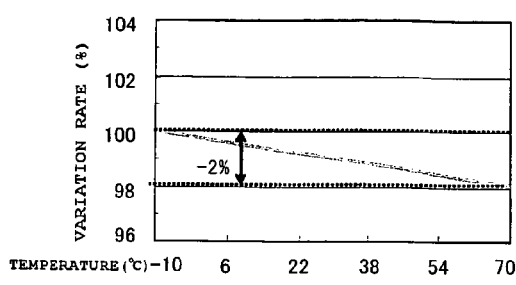
FIG. 5A is a graph showing a temperature dependence of a feedback resistor as the temperature dependence of each of parameters according to the second embodiment of the present invention.

FIG. 5A shows the temperature dependence of the resistance value of the feedback resistor according to the present embodiment. Incidentally, the resistance value is normalized by a resistance value at the temperature of −10° C.

In the case shown in FIG. 5A, the resistance value of the feedback resistor 13 varies by approximately −2% in the range of ambient temperature from −10° C. to 70° C.

Figure 5B:
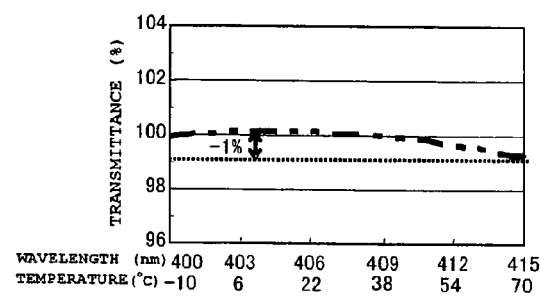
FIG. 5B is a graph showing a temperature dependence of a transmittance of the protective film as the temperature dependence of each of parameters according to the second embodiment of the present invention.

FIG. 5B shows the temperature dependence of the transmittance of the glass plate 21 coated with the light transmitting member. Incidentally, the transmittance is normalized by a transmittance at the temperature of −10° C. As shown in FIG. 5B, the transmittance varies by approximately −1% in the range of ambient temperature from −10° C. to 70° C.

Figure 5C:
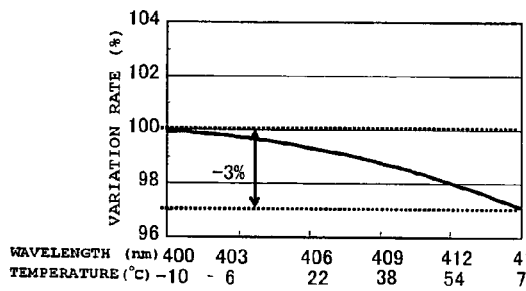
FIG. 5C is a graph showing a temperature dependence of an output voltage from the light receiving circuit as the temperature dependence of each of parameters according to the second embodiment of the present invention.

FIG. 5C shows the temperature dependence of the output voltage Vo from the light receiving circuit provided with the feedback resistor 13 and the glass plate 21 having the characteristics shown in FIGS. 5A and 5B, respectively. Incidentally, the output voltage is normalized by an output voltage at the temperature of −10° C.

As shown in FIG. 5C, the output voltage Vo varies by approximately −3% in the range of ambient temperature from −10° C. to 70° C., which results in a sum of the changes in resistance value and transmittance with the temperature change shown in FIGS. 5A and 5B, respectively.

Figure 5D:
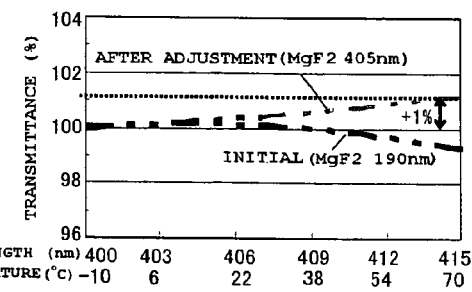
FIG. 5D is a graph showing a temperature dependence of a transmittance of a coating film after adjustment in thickness as the temperature dependence of each of parameters according to the second embodiment of the present invention.

Herein, the transmittance of the glass plate is adjusted by changing the film thickness of magnesium fluoride from approximately 190 nm to approximately 405 nm. FIG. 5D shows the temperature dependence of the transmittance of the glass plate with this configuration. As can be understood from the figure, while the variation in transmittance of the protective film before adjustment has been approximately −1% in the range of temperature from −10° C. to 70° C., the change can be improved to be approximately +31% after adjustment.

Figure 5E:
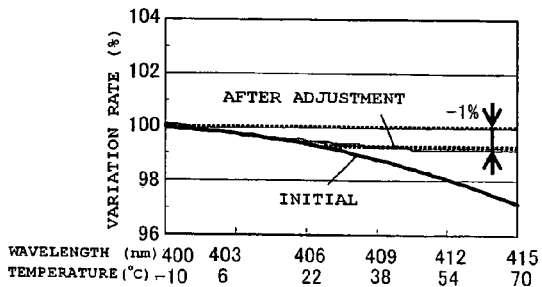
FIG. 5E is a graph showing a temperature dependence of the output voltage after adjustment in thickness of the coating film as the temperature dependence of each of parameters according to the second embodiment of the present invention.

FIG. 5E shows the temperature dependence of the output voltage Vo after adjusting the film thickness of the light transmitting member 20 as described above. As can be understood from the figure, while the variation in the output voltage before adjustment has been approximately −3% in the range of temperature from −10° C. to 70° C., the change can be suppressed to be approximately −1% after adjustment.

THIRD EMBODIMENT

Figure 6:
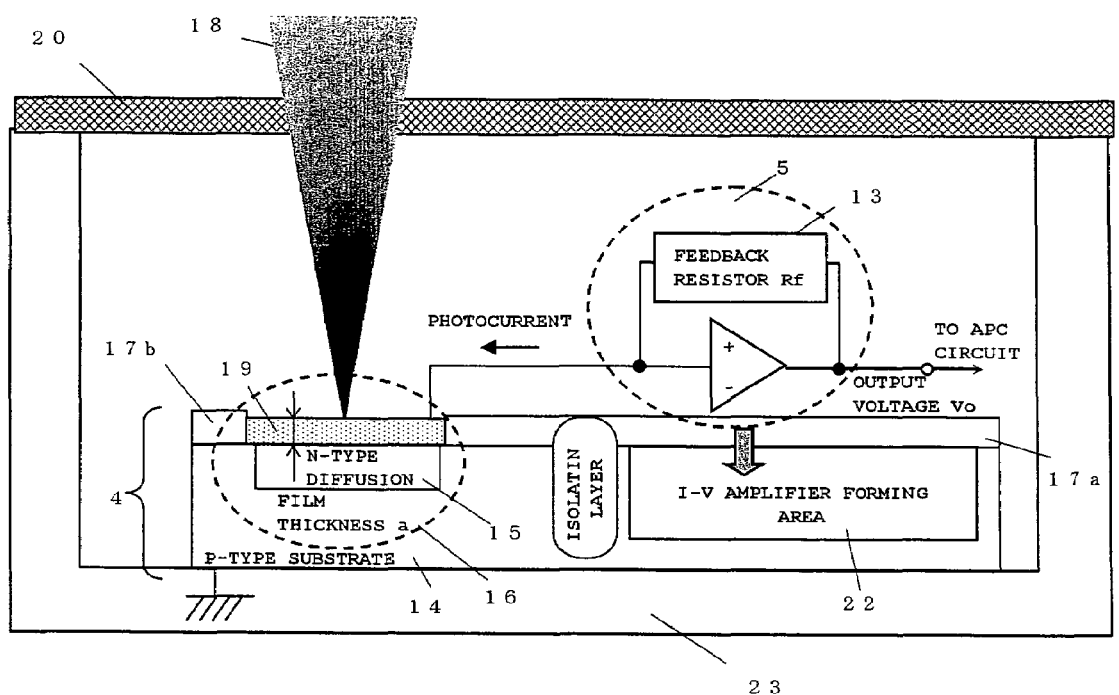
FIG. 6 is a diagram illustrating a configuration of a light receiving circuit according to a third embodiment of the present invention.
Figure 8A:
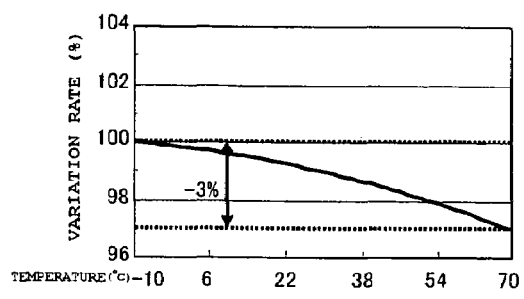
FIG. 8A is a graph showing a temperature dependence of an output voltage from the light receiving circuit as the temperature dependence of each of parameters according to the conventional art.
Figure 8B:
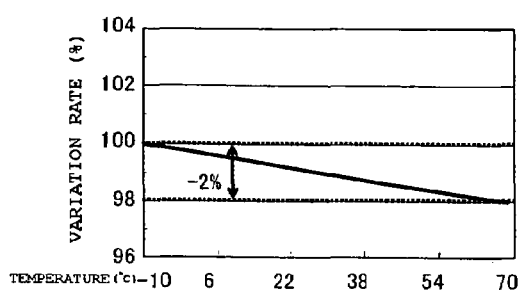
FIG. 8B is a graph showing a temperature dependence of a feedback resistor as the temperature dependence of each of parameters according to the conventional art.
Figure 8C:
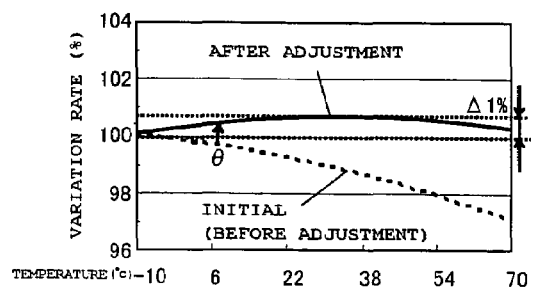
FIG. 8C is a graph showing a temperature dependence of the output voltage from the light receiving circuit after adjustment as the temperature dependence of each of parameters according to the conventional art.
Figure 8D:
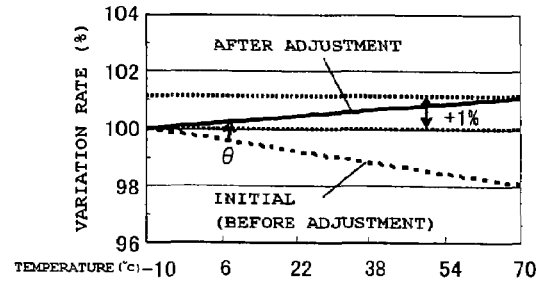
FIG. 8D is a graph showing a temperature dependence of the feedback resistor after adjustment as the temperature dependence of each of parameters according to the conventional art.

FIG. 6 is a diagram illustrating a configuration of the light receiving circuit according to a third embodiment of the present invention.

In FIG. 6, reference numeral 22 represents an area for forming an I-V amplifier, and reference numeral 23 represents a package. For the other elements common with those in FIGS. 1 and 4, the same reference numerals with FIGS. 1 and 4A through 4C are provided and the description thereof will be omitted.

The area for forming the I-V amplifier 22 is an area for forming the photocurrent/voltage conversion amplifier 5 (I-V amplifier) for LD power monitoring on the p-type semiconductor substrate 14, and is characterized in that the light receiving section 16 and the I-V amplifier 5 are formed on the same semiconductor substrate 14.

Moreover, the package 23 is provided for protecting the p-type semiconductor substrate 14 from a mechanical damage or the like, wherein the light transmitting member 20 is disposed on top of the package 23 to be used as a cover of the package 23.

The incident light 18 passes through the light transmitting member 20 from above the package 23 and enters into the light receiving section 16.

According to the present embodiment, while achieving the effect similar to that described in the first and second embodiments, the device can be downsized because the light receiving section 16 and the I-V amplifier 5 are formed on the same p-type semiconductor substrate 14, and as a result of it, a transmission loss of the current between the light receiving section and the I-V amplifier can be reduced, thereby making it possible to configure the light receiving circuit with high sensitivity.

Incidentally, the p-type semiconductor substrate 14 is not limited to that describe above, but the other types of semiconductor substrates may be used.

Moreover, in FIG. 6, while the light transmitting member 20 covers the whole area of the package 23 as the cover of the package 23, the cover is not necessarily made entirely by the light transmitting member as long as at least a portion where the incident light 18 passes therethrough is configured by the light transmitting member.

At this time, as the light transmitting member 20, the glass or the like with the coating on the surface may be used as described in the second embodiment, or the protective film may be deposited on the light receiving section.

Meanwhile, while the examples to flatten the temperature dependence of the output from the light receiving circuit for LD power monitoring have been discussed in the aforementioned description, the present invention is not limited to the device for LD power monitoring, and can achieve the similar effects even when being applied to the general light receiving circuit used for such as the optical information processing, the optical measurement, the optical communication or the like.

Since the light receiving circuit, the semiconductor laser device, and the optical pickup device according to the present invention can prevent the output variation due to the change in ambient temperature, they are useful in the application to the light receiving circuit, the semiconductor laser device, the optical pickup device and the like used for recording or reproduction of such as the DVD or the CD.

What is claimed is:

1. A light receiving circuit comprising a light receiving section, and a photocurrent/voltage conversion amplifier for amplifying a photocurrent photoelectrically converted in said light receiving section, wherein
   a protective film is formed on said light receiving section, said protective film having a temperature coefficient of a transmittance of said protective film in accordance with a change in wavelength of a light transmitting therethrough;
   a feedback resistor related to a gain is connected to said photocurrent/voltage conversion amplifier, said feedback resistor having the temperature coefficient of a resistance in accordance with a temperature change; and
   said temperature coefficient of the transmittance and said temperature coefficient of the resistance are set so that an output voltage from said photocurrent/voltage conversion amplifier may be substantially constant to the temperature change.

2. The light receiving circuit according to claim 1, wherein said light receiving section and said photocurrent/voltage conversion amplifier are formed on the same semiconductor substrate.

3. The light receiving circuit according to claim 1, wherein said light receiving section and said photocurrent/voltage conversion amplifier are housed in the same package.

4. The light receiving circuit according to claim 2, wherein said light receiving section and said photocurrent/voltage conversion amplifier are housed in the same package.

5. The light receiving circuit according to claim 3, wherein a light transmitting member is disposed on at least a portion of said package, where a light enters thereinto.

6. The light receiving circuit according to claim 4, wherein a light transmitting member is disposed on at least a portion of said package, where the light enters thereinto.

7. A semiconductor laser device comprising a semiconductor laser diode, and said light receiving circuit according to claim 1, wherein said light receiving circuit monitors an output from said semiconductor laser diode.

8. A semiconductor laser device comprising a semiconductor laser diode, and said light receiving circuit according to claim 2, wherein said light receiving circuit monitors an output from said semiconductor laser diode.

9. A semiconductor laser device comprising a semiconductor laser diode, and said light receiving circuit according to claim 3, wherein said light receiving circuit monitors an output from said semiconductor laser diode.

10. A semiconductor laser device comprising a semiconductor laser diode, and said light receiving circuit according to claim 4, wherein said light receiving circuit monitors an output from said semiconductor laser diode.

11. A semiconductor laser device comprising a semiconductor laser diode, and said light receiving circuit according to claim 5, wherein said light receiving circuit monitors an output from said semiconductor laser diode.

12. A semiconductor laser device comprising a semiconductor laser diode, and said light receiving circuit according to claim 6, wherein said light receiving circuit monitors an output from said semiconductor laser diode.

13. An optical pickup device comprising the semiconductor laser device according to claim 7, and another light receiving section for receiving a reflected light that is emitted from said semiconductor laser device and reflected from a recording medium.

14. An optical pickup device comprising said semiconductor laser device according to claim 8, and another light receiving section for receiving a reflected light that is emitted from said semiconductor laser device and reflected from a recording medium.

15. An optical pickup device comprising said semiconductor laser device according to claim 9, and another light receiving section for receiving a reflected light that is emitted from said semiconductor laser device and reflected from a recording medium.

16. An optical pickup device comprising said semiconductor laser device according to claim 10, and another light receiving section for receiving a reflected light that is emitted from said semiconductor laser device and reflected from a recording medium.

17. An optical pickup device comprising said semiconductor laser device according to claim 11, and another light receiving section for receiving a reflected light that is emitted from said semiconductor laser device and reflected from a recording medium.

18. An optical pickup device comprising said semiconductor laser device according to claim 12, and another light receiving section for receiving a reflected light that is emitted from said semiconductor laser device and reflected from a recording medium.

19. A light receiving circuit comprising a light receiving section, and a photocurrent/voltage conversion amplifier for amplifying a photocurrent photoelectrically converted in said light receiving section, wherein
   a light transmitting member is disposed on said light receiving section, said light transmitting member having a temperature coefficient of a transmittance of said light transmitting member in accordance with a change in wavelength of a light transmitting therethrough;
   a feedback resistor related to a gain is connected to said photocurrent/voltage conversion amplifier, said feedback resistor having a temperature coefficient of a resistance in accordance with a temperature change; and
   said temperature coefficient of the transmittance and said temperature coefficient of the resistance are set so that an output voltage from said photocurrent/voltage conversion amplifier may be substantially constant to the temperature change.

20. The light receiving circuit according to claim 19, wherein said light receiving section and said photocurrent/voltage conversion amplifier are formed on the same semiconductor substrate.

21. The light receiving circuit according to claim 19, wherein said light receiving section and said photocurrent/voltage conversion amplifier are housed in the same package.

22. The light receiving circuit according to claim 20, wherein said light receiving section and said photocurrent/voltage conversion amplifier are housed in the same package.

23. The light receiving circuit according to claim 21, wherein said light transmitting member is disposed on at least a portion of said package, where the light enters thereinto.

24. The light receiving circuit according to claim 22, wherein said light transmitting member is disposed on at least a portion of said package, where the light enters thereinto 25. A semiconductor laser device comprising a semiconductor laser diode, and said light receiving circuit according to claim 19, wherein said light receiving circuit monitors an output from said semiconductor laser diode.

26. A semiconductor laser device comprising a semiconductor laser diode, and said light receiving circuit according to claim 20, wherein said light receiving circuit monitors an output from said semiconductor laser diode.

27. A semiconductor laser device comprising a semiconductor laser diode, and said light receiving circuit according to claim 21, wherein said light receiving circuit monitors an output from said semiconductor laser diode.

28. A semiconductor laser device comprising a semiconductor laser diode, and said light receiving circuit according to claim 22, wherein said light receiving circuit monitors an output from said semiconductor laser diode.

29. A semiconductor laser device comprising a semiconductor laser diode, and said light receiving circuit according to claim 23, wherein said light receiving circuit monitors an output from said semiconductor laser diode.

30. A semiconductor laser device comprising a semiconductor laser diode, and said light receiving circuit according to claim 24, wherein said light receiving circuit monitors an output from said semiconductor laser diode.

31. An optical pickup device comprising the semiconductor laser device according to claim 25, and another light receiving section for receiving a reflected light that is emitted from said semiconductor laser device and reflected froma recording medium.

32. An optical pickup device comprising said semiconductor laser device according to claim 26, and another light receiving section for receiving a reflected light that is emitted from said semiconductor laser device and reflected from a recording medium.

33. An optical pickup device comprising said semiconductor laser device according to claim 27, and another light receiving section for receiving a reflected light that is emitted from said semiconductor laser device and reflected from a recording medium.

34. An optical pickup device comprising said semiconductor laser device according to claim 28, and another light receiving section for receiving a reflected light that is emitted from said semiconductor laser device and reflected from a recording medium.

35. An optical pickup device comprising said semiconductor laser device according to claim 29, and another light receiving section for receiving a reflected light that is emitted from said semiconductor laser device and reflected from a recording medium.

36. An optical pickup device comprising said semiconductor laser device according to claim 30, and another light receiving section for receiving a reflected light that is emitted from said semiconductor laser device and reflected from a recording medium.

37. A light receiving circuit comprising a light receiving section, and a photocurrent/voltage conversion amplifier for amplifying a photocurrent photoelectrically converted in said light receiving section, wherein
    a protective film is formed on said light receiving section while a light transmitting member is disposed thereon, said protective film and said light transmitting member respectively having temperature coefficients of transmittances in accordance with a change in wavelength of a light transmitting therethrough;
    a feedback resistor related to a gain is connected to the photocurrent/voltage conversion amplifier, said feedback resistor having a temperature coefficient of a resistance in accordance with a temperature change; and
    the temperature coefficients of said transmittances of said protective film and said light transmitting member, and the temperature coefficient of said resistance are set so that an output voltage from said photocurrent/voltage conversion amplifier may be substantially constant to the temperature change.

38. A semiconductor laser device comprising a semiconductor laser diode, and said light receiving circuit according to claim 37, wherein said light receiving circuit monitors an output from said semiconductor laser diode.

39. An optical pickup device comprising said semiconductor laser device according to claim 38, and another light receiving section for receiving a reflected light that is emitted from said semiconductor laser device and reflected from a recording medium.

* * * * *